United States Patent
Osumi et al.

(10) Patent No.: US 12,428,533 B2
(45) Date of Patent: Sep. 30, 2025

(54) RESIN COMPOSITION FOR METAL-CLAD LAMINATES, PREPREG, AND METAL-CLAD LAMINATE

(71) Applicant: NIPPON SODA CO., LTD., Tokyo (JP)

(72) Inventors: Shota Osumi, Chiba (JP); Izumi Tando, Chiba (JP); Hiroki Ueda, Chiba (JP); Yoshio Hayakawa, Chiba (JP)

(73) Assignee: NIPPON SODA CO., LTD., Tokyo (JP)

( * ) Notice: Subject to any disclaimer, the term of this patent is extended or adjusted under 35 U.S.C. 154(b) by 736 days.

(21) Appl. No.: 17/632,116

(22) PCT Filed: Jul. 7, 2020

(86) PCT No.: PCT/JP2020/026570
§ 371 (c)(1),
(2) Date: Feb. 1, 2022

(87) PCT Pub. No.: WO2021/024680
PCT Pub. Date: Feb. 11, 2021

(65) Prior Publication Data
US 2022/0275195 A1    Sep. 1, 2022

(30) Foreign Application Priority Data

Aug. 6, 2019 (JP) .................. 2019-144172
Feb. 27, 2020 (JP) .................. 2020-031657

(51) Int. Cl.
*C08J 5/24* (2006.01)
*C08L 9/00* (2006.01)
*C08L 53/02* (2006.01)

(52) U.S. Cl.
CPC ............... *C08J 5/244* (2021.05); *C08J 5/249* (2021.05); *C08L 9/00* (2013.01); *C08L 53/02* (2013.01); *C08J 2309/00* (2013.01); *C08J 2353/02* (2013.01)

(58) Field of Classification Search
CPC ......... C08J 5/244; C08J 2353/02; C08L 9/00; C08L 53/02
See application file for complete search history.

(56) References Cited

U.S. PATENT DOCUMENTS

| 3,636,141 A | 1/1972 | ONeill et al. |
| 5,567,769 A | 10/1996 | Shine et al. |
| 2022/0251376 A1 | 8/2022 | Osumi et al. |

FOREIGN PATENT DOCUMENTS

| JP | 8-208856 | 8/1996 | |
| JP | 2009-013306 A | * 1/2009 | ............ C08F 283/01 |
| JP | 2009-161638 | 7/2009 | |
| WO | 2018/164833 A1 | 9/2018 | |

OTHER PUBLICATIONS

English Machine Translation of JP2009013306 (A) obtained on Mar. 28, 2024 from https://worldwide.espacenet.com/publicationDetails/biblio?CC=JP&NR=2009013306A&KC=A&FT=D&ND=3&date=20090122&DB=&locale=en_EP (Year: 2009).*
Technical data sheet Nippon Soda Co, Ltd https://www.nippon-soda.co.jp/e/pb-j/pdf/list/nisso-pb_b_series.pdf (Year: 2014).*
Journal of Applied Polymer Science, vol. 45, Issue 11, 1992, pp. 2049-2056, Thermodynamic Interactions of Solvents with Styrene-Butadiene-Styrene Triblock Copolymers by Romdhane et al. (Year: 1992).*

* cited by examiner

*Primary Examiner* — Catherine S Branch
*Assistant Examiner* — Olga Lucia Donahue
(74) *Attorney, Agent, or Firm* — GREENBLUM & BERNSTEIN P.L.C.

(57) ABSTRACT

A resin composition for a metal-clad laminate plate includes a block copolymer comprising a butadiene block having a molar ratio of a 1,2-bonding structure to a 1,4-bonding structure of 80:20 to 100:0 and a styrene block. Further, the resin composition for the metal-clad laminate plate includes polybutadiene having a molar ratio of a 1,2-bonding structure to a 1,4-bonding structure of 80:20 to 100:0.

2 Claims, No Drawings

RESIN COMPOSITION FOR METAL-CLAD LAMINATES, PREPREG, AND METAL-CLAD LAMINATE

TECHNICAL FIELD

The present invention relates to a resin composition for a metal-clad laminate plate, a prepreg, and a metal-clad laminate plate. The present application claims priority based on Japanese Patent Application No. 2019-144172 filed on Aug. 6, 2019, and Japanese Patent Application No. 2020-031657 filed on Feb. 27, 2020, the content of which is incorporated herein by reference.

BACKGROUND ART

In recent years, an increase in the capacity of signals has been progressed in electrical equipment, and thus the materials used for semiconductor substrates and the like are desired to have dielectric characteristics such as a low dielectric constant and a low dielectric loss tangent which are required for high-speed communications.

Patent Document 1 proposes a thermosetting resin composition comprising: (A) a modified polyphenylene ether compound having the group of the following formula (1) at its terminal, (B) a crosslinking agent having a molecular weight of 10,000 or less, a functional group equivalent of 500 or more, and an ethylenically unsaturated double bond, (C) a hydrogenated styrene-based thermoplastic elastomer having a weight average molecular weight of 10,000 or more, (D) a curing accelerator, (E) an inorganic filler, and (F) a flame retardant. Patent Document 1 describes that the composition has excellent processability and handleability while maintaining dielectric characteristics, is capable of preventing the warpage after molding, and further, is capable of sufficiently preventing the occurrence of thermal degradation in dielectric characteristics.

[Formula 1]

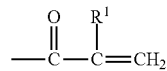

(1)

(In formula (1), $R^1$ is a hydrogen atom or an alkyl group.)

PRIOR ART DOCUMENTS

Patent Documents

Patent Document 1: Japanese unexamined Patent Application Publication No. 2019-44090

SUMMARY OF THE INVENTION

Object to be Solved by the Invention

The metal-clad laminate plates produced using conventionally known resin compositions for a metal-clad laminate plate sometimes have insufficient heat resistance and water resistance. An object of the present invention is to provide a new resin composition for a metal-clad laminate plate capable of producing a metal-clad laminate plate having excellent heat resistance, water resistance, and the like.

Means to Solve the Object

The present inventors have intensively studied to solve the above problems, and as a result, found out a resin composition for a metal-clad laminate plate, comprising (A) a block copolymer comprising a butadiene block having a molar ratio of a 1,2-bonding structure to a 1,4-bonding structure of 80:20 to 100:0 and a styrene block, and a resin composition for a metal-clad laminate plate, comprising (A) a styrene-butadiene-styrene block copolymer (SBS) having a molar ratio of a 1,2-bonding structure to a 1,4-bonding structure in a butadiene block of 80:20 to 100:0. In addition, the present inventors have found out a resin composition for a metal-clad laminate plate, comprising (A) a block copolymer comprising a butadiene block having a molar ratio of a 1,2-bonding structure to a 1,4-bonding structure of 80:20 to 100:0 and a styrene block, and (B) polybutadiene having a molar ratio of a 1,2-bonding structure to a 1,4-bonding structure of 80:20 to 100:0, and a resin composition for a metal-clad laminate plate, comprising (A) a styrene-butadiene-styrene block copolymer (SBS) having a molar ratio of a 1,2-bonding structure to a 1,4-bonding structure in a butadiene block of 80:20 to 100:0, and (B) polybutadiene having a molar ratio of a 1,2-bonding structure to a 1,4-bonding structure of 80:20 to 100:0.

That is, the present invention encompasses the following aspects.

(1) A resin composition for a metal-clad laminate plate, comprising (A) a block copolymer comprising a butadiene block having a molar ratio of a 1,2-bonding structure to a 1,4-bonding structure of 80:20 to 100:0 and a styrene block.

(2) A resin composition for a metal-clad laminate plate, comprising (A) a styrene-butadiene-styrene block copolymer (SBS) having a molar ratio of a 1,2-bonding structure to a 1,4-bonding structure in a butadiene block of 80:20 to 100:0.

(3) A resin composition for a metal-clad laminate plate, comprising:
(A) a block copolymer comprising a butadiene block having a molar ratio of a 1,2-bonding structure to a 1,4-bonding structure of 80:20 to 100:0 and a styrene block, and
(B) polybutadiene having a molar ratio of a 1,2-bonding structure to a 1,4-bonding structure of 80:20 to 100:0.

(4) A resin composition for a metal-clad laminate plate, comprising:
(A) a styrene-butadiene-styrene block copolymer (SBS) having a molar ratio of a 1,2-bonding structure to a 1,4-bonding structure in a butadiene block of 80:20 to 100:0, and
(B) polybutadiene having a molar ratio of a 1,2-bonding structure to a 1,4-bonding structure of 80:20 to 100:0.

(5) The resin composition for a metal-clad laminate plate according to any one of (1) to (4), wherein a weight ratio of the styrene block to the butadiene block in the component (A) is 10:90 to 80:20.

(6) The resin composition for a metal-clad laminate plate according to any one of (1) to (5), wherein a weight average molecular weight (Mw) of the component (A) is 2,000 to 100,000.

(7) The resin composition for a metal-clad laminate plate according to any one of (1) to (6), wherein a molecular weight distribution (Mw/Mn) of the component (A) is 1.00 to 3.00.

(8) The resin composition for a metal-clad laminate plate according to any one of (3) to (7), wherein a weight average molecular weight (Mn) of the component (B) is 500 to 5,000.
(9) The resin composition for a metal-clad laminate plate according to any one of (3) to (8), wherein a content ratio of the component (A) to the component (B) is component (A):component (B)=5:95 to 95:5 in terms of weight ratio.
(10) The resin composition for a metal-clad laminate plate according to any one of (1) to (9), further comprising a crosslinking agent.
(11) The resin composition for a metal-clad laminate plate according to any one of (1) to (10), further comprising a flame retardant.
(12) A prepreg wherein the resin composition for a metal-clad laminate plate according to any one of (1) to (11) is impregnated in a base material.
(13) A metal-clad laminate plate produced by laminating the prepreg according to (12) and a metal foil by hot press molding.

Effect of the Invention

By using the resin composition for a metal-clad laminate plate of the present invention, a metal-clad laminate plate having excellent heat resistance and water resistance can be produced.

Mode of Carrying Out the Invention (Block Copolymer Comprising Butadiene Block and Styrene Block)

Component (A) used in the present invention is a block copolymer comprising a butadiene block and a styrene block. The styrene block is a block obtained by polymerizing styrene, and the butadiene block is a block obtained by polymerizing butadiene. As the block copolymer comprising a butadiene block and a styrene block, a styrene-butadiene block copolymer (SB), a styrene-butadiene-styrene block copolymer (SBS), a butadiene-styrene-butadiene block copolymer (BSB), or the like may be exemplified. Among these, the styrene-butadiene-styrene block copolymer (SBS) is preferable.

The butadiene block consists of the 1,2-bonding structure of formula (1) and the 1,4-bonding structure of formula (2).

[Formula 2]

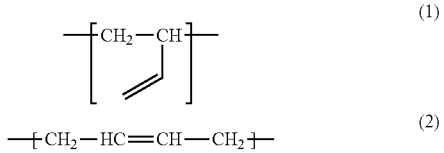

The molar ratio of the 1,2-bonding structure of formula (1) to the 1,4-bonding structure of formula (2) comprised in the butadiene block in the block copolymer comprising the butadiene block and the styrene block used in the present invention is preferably 80:20 to 100:0.

The weight ratio of the styrene block to the butadiene block in the block copolymer comprising the butadiene block and the styrene block is not particularly limited, but 10:90 to 80:20, 10:90 to 70:30, 10:90 to 60:40, 20:80 to 80:20, 30:70 to 80:20, 40:60 to 80:20, or the like may be exemplified. Among these, 10:90 to 80:20, 10:90 to 70:30, or 10:90 to 60:40 is preferable.

The weight average molecular weight (Mw) of the block copolymer comprising the butadiene block and the styrene block is not particularly limited, but 2,000 to 100,000, 2,000 to 80,000, 2,000 to 60,000, 2,000 to 50,000, 2,000 to 40,000, more than 4,742 to 100,000, more than 4,742 to 80,000, more than 4,742 to 60,000, more than 4,742 to 50,000, more than 4,742 to 40,000, or the like may be exemplified. The molecular weight distribution (Mw/Mn) of the block copolymer comprising the butadiene block and the styrene block is not particularly limited, but 1.00 to 3.00, 1.00 to 2.00, or the like may be exemplified. The weight average molecular weight (Mw) and the molecular weight distribution (Mw/Mn) are measured by gel permeation chromatography (GPC) using polystyrene as a standard substance. The measurement conditions are as follows: a mobile phase: THF (tetrahydrofuran), a mobile phase flow rate: 1 mL/min, a column temperature: 40° C., a sample injection volume: 40 μL, and a sample concentration: 2% by weight.

A method for producing the block copolymer comprising the butadiene block and the styrene block used in the present invention is not particularly limited, but for example, the styrene-butadiene-styrene block copolymer may be produced by the method described in, for example, Japanese unexamined Patent Application Publication No. 1994-192502, Japanese unexamined Patent Application Publication (Translation of PCT Application) No. 2000-514122, and Japanese unexamined Patent Application Publication No. 2007-302901, and a method analogous thereto.

(Polybutadiene)

The component (B) used in the present invention is not particularly limited, as long as it is a polymer compound obtained by polymerizing 1,3-butadiene. That is, the polybutadiene used in the present invention consists only of a repeating unit of formula (1), or consists of the repeating unit of formula (1) and a repeating unit of formula (2). The proportion of the repeating unit of formula (1) and the repeating unit of formula (2) comprised in the polybutadiene is not particularly limited, but the molar ratio of the repeating unit of formula (1) to the repeating unit of formula (2) is preferably 80:20 to 100:0, based on the total repeating unit in the polybutadiene.

The molecular weight of the polybutadiene used in the present invention is not particularly limited, but a weight average molecular weight (Mw) in a range of 500 to 10,000, 500 to 8,000, 500 to 6,000, or 500 to 5,000 may be selected. The weight average molecular weight (Mw) and the number average molecular weight (Mn) are values obtained by converting data measured by gel permeation chromatography (GPC) using tetrahydrofuran as a solvent based on the molecular weight of standard polystyrene.

The polybutadiene may be polybutadiene the backbone and the terminal of which are modified, or may be polybutadiene the backbone and the terminal of which are not modified. Among these, the polybutadiene the backbone and terminal of which are not modified is preferably used from the viewpoint of obtaining a cured product having high insulating properties.

As the polybutadiene, a commercial product may be used. As the commercial polybutadiene, NISSO-PB(R) B-1000 (manufactured by Nippon Soda Co., Ltd.), NISSO-PB B-2000 (manufactured by Nippon Soda Co., Ltd.), NISSO-PB B-3000 (manufactured by Nippon Soda Co., Ltd.), or the like may be exemplified. These polybutadienes may be used alone or used by combination of two or more thereof.

(Resin Composition for Metal-Clad Laminate Plate)

The resin composition for a metal-clad laminate plate of the present invention is a resin composition for a metal-clad laminate plate, comprising a block copolymer comprising a butadiene block and a styrene block (the component (A)). In addition, the resin composition for a metal-clad laminate plate of the present invention is a resin composition for a metal-clad laminate plate, comprising a block copolymer comprising a butadiene block and a styrene block (the component (A)), and polybutadiene (the component (B)).

The content ratio of the component (A) to the component (B) in the resin composition for a metal-clad laminate plate of the present invention is not particularly limited, but component (A):component (B)=5:95 to 95:5, 10:90 to 90:10, 20:80 to 80:20, 30:70 to 70:30, or the like, in terms of a weight ratio may be exemplified.

(Other Additives)

Other additives may be appropriately added to the resin composition for a metal-clad laminate plate of the present invention, within a range not impairing the effects of the present invention. As other additives, an initiator, a crosslinking agent, a flame retardant, an inorganic filler, or the like may be exemplified.

The initiator is not particularly limited. Specifically, benzoyl peroxide, cumene hydroperoxide, 2,5-dimethylhexane-2,5-dihydroperoxide, 2,5-dimethyl-2,5-di(t-butylperoxy)hexine-3, di-t-butyl peroxide, t-butylcumyl peroxide, α,α'-bis(t-butylperoxy-m-isopropyl)benzene, 2,5-dimethyl-2,5-di(t-butylperoxy)hexane, dicumyl peroxide, di-t-butyl peroxyisophthalate, t-butyl peroxybenzoate, 2,2-bis(t-butylperoxy)butane, 2,2-bis(t-butylperoxy)octane, 2,5-dimethyl-2,5-di(benzoylperoxy)hexane, di(trimethylsilyl)peroxide, trimethylsilyl triphenylsilyl peroxide, or the like may be exemplified. These may be used alone or used by combination of two or more thereof.

The added amount of the initiator is not particularly limited, but an amount of 0.1 to 10% by weight with respect to the combined amount of the component (A) and the component (B) may be exemplified.

The crosslinking agent is not particularly limited. Specifically, divinylbenzene, triallyl isocyanurate, or the like may be exemplified. These may be used alone or used by combination of two or more thereof.

When the crosslinking agent is added, the added amount thereof is not particularly limited, but an amount of 1 to 50% by weight with respect to the combined amount of the component (A) and the component (B) may be exemplified.

The flame retardant is not particularly limited. Specifically, a halogen-based flame retardant such as a bromine-based flame retardant, a phosphorus-based flame retardant, or the like may be exemplified.

As the halogen-based flame retardant, a bromine-based flame retardant such as pentabromodiphenyl ether, octabromodiphenyl ether, decabromodiphenyl ether, tetrabromobisphenol A, and hexabromocyclododecane, a chlorine-based flame retardant such as chlorinated paraffin, or the like may be exemplified. These may be used alone or used by combination of two or more thereof.

As the phosphorus-based flame retardant, a phosphoric acid ester such as a condensed phosphoric acid ester and a cyclic phosphoric acid ester, a phosphazene compound such as a cyclic phosphazene compound, a phosphinate-based flame retardant such as aluminum dialkyl phosphinate, a melamine-based flame retardant such as melamine phosphate and melamine polyphosphate, or the like may be exemplified. These may be used alone or used by combination of two or more thereof.

When the flame retardant is added, the added amount thereof is not particularly limited, but an amount of 1 to 20% by weight with respect to the combined amount of the component (A) and the component (B) may be exemplified.

As the inorganic filler, silica, alumina, talc, aluminum hydroxide, magnesium hydroxide, titanium oxide, mica, aluminum borate, barium sulfate, calcium carbonate, or the like may be exemplified. These may be used alone or used by combination of two or more thereof.

When the inorganic filler is added, the added amount thereof is not particularly limited, but an amount of 10 to 150% by weight with respect to the combined amount of the component (A) and the component (B) may be exemplified.

The method for producing the resin composition for a metal-clad laminate plate of the present invention is not particularly limited. For example, a method in which the polybutadiene (B) and other components are added to the block copolymer comprising the butadiene block and the styrene block (A) and then kneaded with a kneading machine may be exemplified.

(Prepreg)

When a prepreg is produced, the resin composition for a metal-clad laminate plate of the present invention is often used by being prepared in a varnish form to impregnate the composition in a base material (fibrous base material) for forming the prepreg. Such a resin varnish is, for example, prepared as follows.

First, respective components that can be dissolved in an organic solvent are put in the organic solvent for dissolution. At this time, components may be heated, as needed. Thereafter, when necessary, components that cannot be dissolved in the organic solvent, such as the inorganic filler, are added and dispersed using a ball mill, a bead mill, a planetary mixer, a roll mill, or the like until a predetermined dispersion state is achieved, whereby a resin varnish is prepared.

As a method for producing a prepreg by using the obtained resin varnish, for example, a method in which the obtained resin varnish is impregnated in a fibrous base material and then dried may be exemplified.

As the fibrous base material used for producing the prepreg, specifically, glass fiber cloth, aramid cloth, polyester cloth, glass nonwoven fabric, aramid nonwoven fabric, polyester nonwoven fabric, pulp paper, printer paper, or the like may be exemplified.

The fibrous base material in which the resin varnish is impregnated is heated under desired heating conditions, for example, at 80 to 170° C. for 1 to 10 minutes, to remove the solvent, whereby a prepreg in a semi-cured state (B stage) can be obtained.

(Metal-Clad Laminate Plate)

One or a plurality of the obtained prepregs are stacked, a metal foil such as copper foil is further stacked on both the top and bottom surfaces or on one surface of the prepreg or the prepreg stack, and this is integrally laminated by hot press molding, whereby a double-sided metal-clad or single-sided metal-clad laminate plate can be fabricated.

The hot press conditions may be appropriately set according to the thickness of the laminate plate to be produced, the kind of resin composition of the prepreg, and the like. For example, the hot press conditions may be set such that the temperature is 170 to 210° C., the pressure is 1.5 to 4.0 MPa, and the time is 60 to 150 minutes.

EXAMPLES

Hereinafter, the present invention will be described in detail by way of Examples, but the present invention is not limited to the scope of Examples.

Component (A): Production of Styrene-Butadiene-Styrene Block Copolymer (SBS)

Production Example 1

Into a 500 mL flask, 151.95 g of tetrahydrofuran (hereinafter, abbreviated as THF) and 19.65 g of hexane were added. After the mixture was cooled to −40° C., 2.28 g of n-butyllithium (a hexane solution with a concentration of 15.1% by weight) was added and stirred for 10 minutes, then 11.99 g of styrene was added dropwise, and the reaction was continued for 30 minutes. The solution was measured by gas chromatography (hereinafter, abbreviated as GC) and the disappearance of monomers was confirmed. Then, a mixed solution of 21.44 g of 1,3-butadiene, 23.43 g of THF, and 7.80 g of hexane was added dropwise, and the reaction was continued. After the solution was measured by GC and the disappearance of monomers was confirmed, 12.05 g of styrene was added dropwise, and after 30 minutes, 0.51 g of methanol was added to terminate the reaction.

The copolymer obtained was analyzed by gel permeation chromatography (mobile phase: THF, polystyrene standards), and it was confirmed that the weight average molecular weight (Mw) was 24,300 and the molecular weight distribution (Mw/Mn) was 1.28. The copolymer obtained was a copolymer having a composition ratio of PS/PB/PS=25/50/25% by weight. Note that PS means the styrene block and PB means the butadiene block. The same applies hereinafter.

The reaction liquid was washed twice with water, and then the solvent was distilled off. This was reprecipitated in methanol, filtered off, and dried in vacuo to obtain a white powder. The 1,2-bonding structure in the butadiene block calculated by $^1$H-NMR was 93 mol %.

Production Example 2

Into a 500 mL flask, 149.37 g of THF and 17.53 g of hexane were added. After the mixture was cooled to −40° C., 5.21 g of n-butyllithium (a hexane solution with a concentration of 15.1% by weight) was added and stirred for 10 minutes, then 10.47 g of styrene was added dropwise, and the reaction was continued for 30 minutes. The solution was measured by gas chromatography (hereinafter, abbreviated as GC) and the disappearance of monomers was confirmed. Then, a mixed solution of 49.28 g of 1,3-butadiene and 49.28 g of THF was added dropwise and the reaction was continued. After the solution was measured by GC and the disappearance of monomers was confirmed, 10.66 g of styrene was added dropwise, and after 30 minutes, 1.12 g of methanol was added to terminate the reaction.

The copolymer obtained was analyzed by gel permeation chromatography (mobile phase: THF, polystyrene standards), and it was confirmed that the weight average molecular weight (Mw) was 14,200 and the molecular weight distribution (Mw/Mn) was 1.18. The copolymer obtained was a copolymer having a composition ratio of PS/PB/PS=15/70/15% by weight.

The reaction liquid was washed twice with water, and then the solvent was distilled off. This was reprecipitated in methanol, filtered off, and dried in vacuo to obtain a colorless and transparent viscous liquid. The 1,2-bonding structure in the butadiene block calculated by $^1$H-NMR was 94 mol %.

Production Example 3

Into a 500 mL flask, 155.90 g of cyclohexane and 20.10 g of THF were added. The mixture was warmed to 30° C., 1.95 g of n-butyllithium (a hexane solution with a concentration of 15.1% by weight) was added and stirred for 10 minutes, then 7.64 g of styrene was added dropwise, and the reaction was continued for 30 minutes. The solution was measured by gas chromatography (hereinafter, abbreviated as GC) and the disappearance of monomers was confirmed. Then, a mixed solution of 35.07 g of 1,3-butadiene and 35.07 g of cyclohexane was added dropwise and the reaction was continued. After the solution was measured by GC and the disappearance of monomers was confirmed, 7.78 g of styrene was added dropwise, and after 30 minutes, 0.40 g of methanol was added to terminate the reaction.

The copolymer obtained was analyzed by gel permeation chromatography (mobile phase: THF, polystyrene standards), and it was confirmed that the weight average molecular weight (Mw) was 17,400 and the molecular weight distribution (Mw/Mn) was 1.07. The copolymer obtained was a copolymer having a composition ratio of PS/PB/PS=15/70/15% by weight.

The reaction liquid was washed twice with water, and then the solvent was distilled off. This was reprecipitated in methanol, filtered off, and dried in vacuo to obtain a colorless and transparent viscous liquid. The 1,2-bonding structure in the butadiene block calculated by $^1$H-NMR was 89 mol %.

Production Example 4

Into a 5,000 mL flask, 1,212 g of THF and 132 g of hexane were added. After the mixture was cooled to −40° C., 98.58 g of n-butyllithium (a hexane solution with a concentration of 15.1% by weight) was added and stirred for 10 minutes, then 60.50 g of styrene was added dropwise, and the reaction was continued for 15 minutes. The solution was measured by gas chromatography (hereinafter, abbreviated as GC) and the disappearance of monomers was confirmed. Then, a mixed solution of 481.88 g of butadiene, 432.12 g of THF, and 48.08 g of hexane was added dropwise and the reaction was continued. After the solution was measured by GC and the disappearance of monomers was confirmed, 61.13 g of styrene was added dropwise, and after 30 minutes, 16.02 g of methanol was added to terminate the reaction.

The copolymer obtained was analyzed by gel permeation chromatography (mobile phase: THF, polystyrene standards), and it was confirmed that the weight average molecular weight (Mw) was 4,742 and the molecular weight distribution (Mw/Mn) was 1.12. The copolymer obtained was a copolymer having a composition ratio of PS/PB/PS=10/80/10% by weight.

The reaction liquid was washed twice with water, and the solvent was distilled off to obtain a white viscous liquid. The 1,2-bonding structure in the butadiene unit calculated by $^1$H-NMR was 91%.

Example 1

Polybutadiene (manufactured by Nippon Soda Co., Ltd., B-3000), the styrene-butadiene-styrene block copolymer obtained in Production Example 1, and dicumyl peroxide (manufactured by Aldrich) were mixed in an amount shown in Table 1 and dissolved in methyl ethyl ketone (hereinafter, referred to as MEK, manufactured by FUJIFILM Wako Pure Chemical Corporation) to obtain a varnish.

Example 2

A varnish was obtained in the same manner as in Example 1, except for using the styrene-butadiene-styrene block copolymer obtained in Production Example 4 instead of the styrene-butadiene-styrene block copolymer obtained in Production Example 1.

Comparative Example 1

A varnish was obtained in the same manner as in Example 1, except for using Kraton D1192 (manufactured by Kraton, styrene-butadiene-styrene block copolymer) instead of the styrene-butadiene-styrene block copolymer obtained in Production Example 1.

(Method for Fabricating Sample for Solder Heat-Resistance Test)

4 pieces of glass fiber cloth which were cut into 3 cm squares were sufficiently impregnated with the varnish and heated in an oven at 150° C. for 10 minutes to fabricate prepregs. The rough surface of a copper foil having a thickness of 18 μm was applied to both surfaces of the obtained prepregs. Thereafter, this was sandwiched by polytetrafluoroethylene plates and hot-pressed using a press at 230° C. under conditions of 3-4 MPa for 2 hours to obtain an evaluation substrate (copper-clad laminate plate).

(Solder Heat-Resistance Test)

The solder heat-resistance test was measured in accordance with JIS C 6481. The solder heat resistance was evaluated by immersing the copper-clad laminate plate in solder at 260° C. for 2 minutes and observing the peeling of the copper foil. When no peeling occurred, it was evaluated as "○," and when peeling occurred, it was evaluated as "x." The results are shown in Table 1.

(Method for Fabricating Sample for Measuring Glass Transition Temperature Tg and Electrical Characteristics)

10 pieces of glass fiber cloth which were cut into cm squares were sufficiently impregnated with the varnish and heated in an oven at 150° C. for 10 minutes to fabricate prepregs. 10 pieces of the prepregs obtained were laminated, and this was sandwiched by polytetrafluoroethylene plates and hot-pressed using a press at 230° C. under conditions of 3-4 MPa for 2 hours to obtain an evaluation substrate (laminate plate).

(Measurement of Glass Transition Temperature Tg)

The Tg of the laminate plate was measured by using a dynamic viscoelasticity apparatus "RSA-G2" manufactured by TA Instruments. At this time, dynamic viscoelasticity measurement (DMA) was carried out with a bending module using a 30 mm dual cantilever as a jig at a frequency of 1 Hz, and the temperature at which the tan δ was maximum when the temperature was raised from −50° C. to 270° C. at a temperature rising rate of 5° C./min was determined as Tg. The results are shown in Table 1.

(Heat Resistance Evaluation)

Dynamic viscoelasticity measurement (DMA) was carried out using a dynamic viscoelasticity apparatus "RSA-G2" manufactured by TA Instruments with a bending module using a 30 mm dual cantilever as a jig at a frequency of 1 Hz, and when two cycles of measurements from −50° C. to 270° C. at a temperature rising rate of 5° C./min were carried out, the difference of Tg between the first cycle and the second cycle, ΔTg was evaluated. The temperature at which the tan δ was maximum was determined as Tg. The results are shown in Table 1.

(Dielectric Characteristics)

The relative dielectric constants (Dk) and dielectric loss tangents (Df) of the evaluation substrates at 10 GHz were measured by the resonant cavity perturbation method. Specifically, the relative dielectric constants and dielectric loss tangents of the test substrates at 10 GHz were measured using a network analyzer (MS46122B, manufactured by Anritsu Corporation). The results are shown in Table 1.

TABLE 1

|  |  | Example 1 | Example 2 | Comparative Example 1 |
|---|---|---|---|---|
| Composition (parts by weight) | B-3000 | 50 | 50 | 50 |
|  | Polymer synthesized in Production Example 1 | 50 |  |  |
|  | Polymer synthesized in Production Example 4 |  | 50 |  |
|  | Kraton D1192 |  |  | 50 |
|  | DCP | 2 | 2 | 2 |
| Evaluation | Solder heat resistance | ○ | ○ | ○ |
|  | Tg (First cycle) (° C.) | 74.3 | 28.9 | 14.1 |
|  | Tg (Second cycle) (° C.) | 81.2 | 40.8 | 10.1 |
|  | ΔTg | 6.9 | 11.9 | −4.1 |
|  | Relative dielectric constant(Dk) | 2.95 | 3.64 | 3.39 |
|  | Dielectric loss tangent(Df) | 0.0051 | 0.0050 | 0.0051 |

These test results revealed that the Tg of the laminate plate produced using the composition of the present invention has excellent heat resistance that is higher than that of Comparative Example.

The invention claimed is:

1. A resin composition, comprising:
(A) a styrene-butadiene-styrene block copolymer (SBS) having
  i) a molar ratio of a 1,2-bonding structure to a 1,4-bonding structure in a butadiene block of 80:20 to 100:0,
  ii) a weight ratio of the styrene block to the butadiene block of 10:90 to 60:40, and
  iii) a weight average molecular weight (Mw) of 4,742 to 24,300;
(B) a polybutadiene having
  i) a molar ratio of a 1,2-bonding structure to a 1,4-bonding structure of 80:20 to 100:0, and
  ii) a weight average molecular weight (Mw) of 500 to 5,000; and
(C) a peroxide initiator.

2. The resin composition according to claim 1, wherein a content ratio of the component (A) to the component (B) is component (A):component (B)=5:95 to 95:5 in terms of weight ratio.

* * * * *